(12) United States Patent
Chen et al.

(10) Patent No.: US 9,000,798 B2
(45) Date of Patent: Apr. 7, 2015

(54) METHOD OF TEST PROBE ALIGNMENT CONTROL

(75) Inventors: Jui-Long Chen, Taichung (TW); Chien-Chih Liao, Miao-Li (TW); Tseng Chin Lo, Hsinchu (TW); Hui-Yun Chao, Zhubei (TW); Ta-Yung Lee, Taipei (TW); Jong-I Mou, Hsinpu Township, Hsinchu County (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 370 days.

(21) Appl. No.: 13/495,421

(22) Filed: Jun. 13, 2012

(65) Prior Publication Data

US 2013/0335109 A1    Dec. 19, 2013

(51) Int. Cl.
*G01R 31/02*      (2006.01)
*G01R 31/28*      (2006.01)
*H01L 23/544*    (2006.01)

(52) U.S. Cl.
CPC .......... *H01L 23/544* (2013.01); *G01R 31/2891* (2013.01); *H01L 2223/54426* (2013.01); *H01L 2223/54453* (2013.01); *H01L 2223/5446* (2013.01); *H01L 2924/00* (2013.01); *H01L 2924/0002* (2013.01)

(58) Field of Classification Search
USPC ............ 324/762.05, 756.03, 762.01, 750.22, 324/750.15–750.19, 754.01–754.03, 324/755.11–756.04
See application file for complete search history.

(56) References Cited

U.S. PATENT DOCUMENTS

| | | | | |
|---|---|---|---|---|
| 4,937,618 | A * | 6/1990 | Ayata et al. | 355/43 |
| 7,319,337 | B2 * | 1/2008 | Sakata | 324/750.16 |
| 2010/0117672 | A1 * | 5/2010 | Portune | 324/758 |
| 2011/0037492 | A1 * | 2/2011 | Seubert et al. | 324/756.03 |

\* cited by examiner

*Primary Examiner* — Tung X Nguyen
*Assistant Examiner* — Alesa Allgood
(74) *Attorney, Agent, or Firm* — Haynes & Boone, LLP

(57) ABSTRACT

A system and method for aligning a probe, such as a wafer-level test probe, with wafer contacts is disclosed. An exemplary method includes receiving a wafer containing a plurality of alignment contacts and a probe card containing a plurality of probe points at a wafer test system. A historical offset correction is received. Based on the historical offset correct, an orientation value for the probe card relative to the wafer is determined. The probe card is aligned to the wafer using the orientation value in an attempt to bring a first probe point into contact with a first alignment contact. The connectivity of the first probe point and the first alignment contact is evaluated. An electrical test of the wafer is performed utilizing the aligned probe card, and the historical offset correction is updated based on the orientation value.

20 Claims, 7 Drawing Sheets

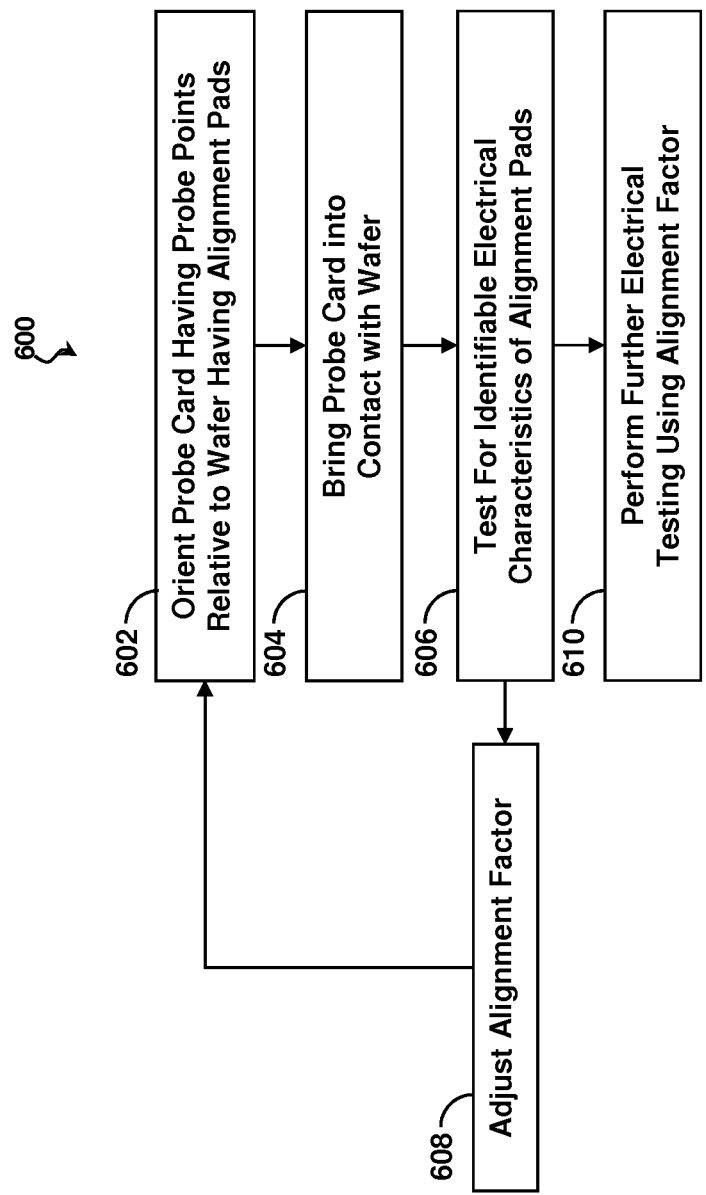

METHOD OF TEST PROBE ALIGNMENT CONTROL

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

For example, one area of manufacturing with room for improvement is wafer testing, a mechanism for determining device performance and manufacturing defects. Prior to dicing (the removal of circuit elements such as chips from a semiconductor wafer), test structures as well as functional devices on the wafer are evaluated for electrical performance. Wafer test systems typically utilize a probe card to make a secure electrical connection to the test pads on the wafer. Misalignment of the probe with the wafer test pads affects test results and can result in damage to the probe card, damage to the wafer, damage to the ICs, and lost yield. Current methods of probe alignment require an operator to visually inspect the contact between probes and pads. If the probe and wafer are not properly aligned, the probe card is removed from the wafer, adjusted, and reapplied.

Despite the qualifications of the test operators, inefficiency and the potential for error remain. Additionally, progress towards smaller devices and larger wafers may increase alignment time and lead to situations where human operators cannot visually align the components without cost-prohibitive microscopy tools. Thus while current wafer test methods have delivered positive results, they have not been entirely satisfactory in all regards. Advances in alignment mechanisms are desirable because they have the potential to improve efficiency, reduce wafer damage, and enable testing of advanced technologies.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 6 is a flow diagram of a method of evaluating the alignment of a probe card and a wafer according to aspects of the present disclosure.

DETAILED DESCRIPTION

Figure 1:
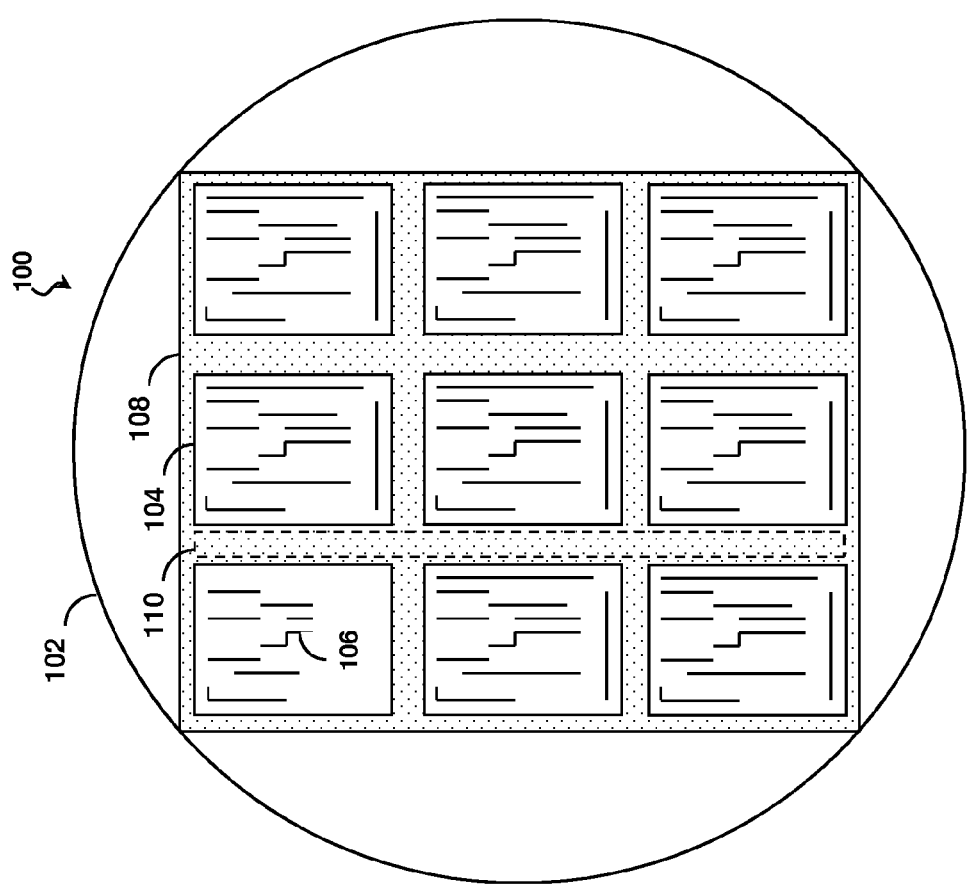
FIG. 1 is a simplified top view of a semiconductor wafer according to various aspects of the present disclosure.

The present disclosure relates generally to wafer test systems and procedures and, more particularly, to a system and method for aligning probe contacts with wafer contacts.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a simplified top view of a semiconductor wafer 100 according to various aspects of the present disclosure. The semiconductor wafer 100 includes a substrate 102 that may include an elementary semiconductor such as silicon or germanium and/or a compound semiconductor, such as silicon germanium, silicon carbide, gallium arsenic, indium arsenide, gallium nitride, and indium phosphide. Other exemplary substrates 102 include alloy semiconductors, such as silicon germanium carbide, gallium arsenic phosphide, and gallium indium phosphide. The substrate 102 may have one or more layers defined within it. In some embodiments, the substrate layers include an epitaxial layer. In one such embodiment, the substrate contains an epitaxial layer overlying a bulk semiconductor. Other layered substrates include semiconductor-on-insulator (SOI) substrates. In one such SOI substrate, the substrate 102 includes a buried oxide (BOX) layer formed by a process such as separation by implanted oxygen (SIMOX).

The substrate 102 may include various p-type doped regions and/or n-type doped regions implanted by a process such as ion implantation and/or diffusion. These doped regions in the substrate 102 may provide various functional devices or features, such as metal-oxide-semiconductor (MOS) transistors, imaging sensors, and combinations thereof. The substrate 102 may include lateral isolation features, such as shallow trench isolation (STI) features, disposed to separate various devices formed on the substrate 102 by a process including lithography patterning, etching, and dielectric material deposition. In an embodiment, regions of the substrate 102 include a plurality of patterned dielectric layers and patterned conductive layers combined to form interconnections configured to couple the various p-type and n-type doped regions and the other functional features. In an embodiment, the substrate 102 includes a multi-layer interconnect (MLI) structure with an inter-level dielectric (ILD) disposed in the MLI structure.

The semiconductor wafer 100 includes one or more dies 104. Each of the dies 104 contains an integrated circuit (IC) having various electrical features 106 configured and interconnected to form the circuit or device. In various embodiments, the integrated circuit includes a field-effect transistor (FET), a bipolar-junction transistor (BJT), a light-emitting diode (LED), an imaging sensor, a memory device, a high power transistor, and/or a high frequency device, such as a blue tooth device or 3G communication device. Other embodiments incorporate other integrated circuit devices. The wafer 100 also includes a reserved area 108 (enlarged here for clarity) between and surrounding the dies 104. In an embodiment, the reserved area 108 contains scribe lines, regions used when separating the dies 104 from the wafer 100.

Figure 2:
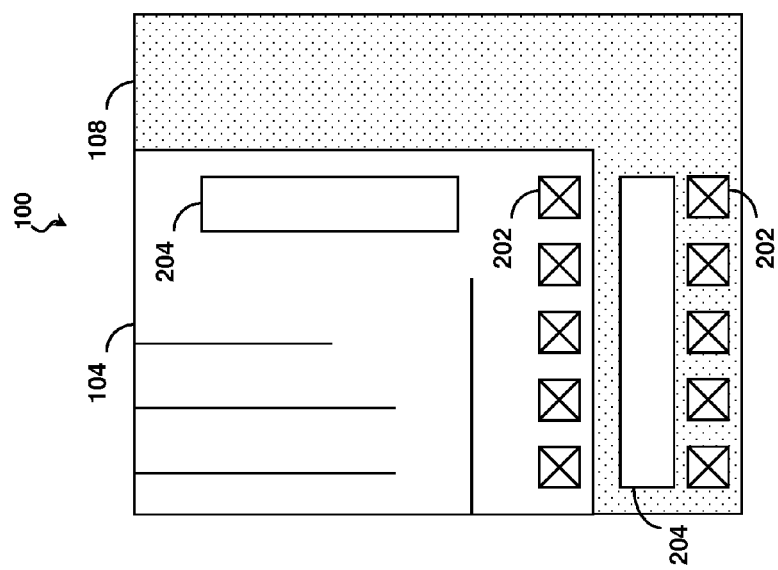
FIG. 2 is a simplified top view of a region of a semiconductor wafer according to various aspects of the present disclosure.

FIG. 2 is a simplified top view of a region of a semiconductor wafer 100 according to various aspects of the present disclosure. FIG. 2 illustrates the border of a die 104 and a reserved area 108. The wafer 100 containing the die 104 and the reserved area 108 includes a number of test pads 202. In some embodiments, the test pads 202 are located within the die 104 region. In some embodiments, the test pads 202 are located within the reserved area 108. In one such embodiment, the test pads 202 are located within a scribe line 110 contained within the reserved area 108. In a further embodiment, the wafer contains test pads 202 within both the die 104 region and the reserved area 108.

The test pads 202 may be connected to functional circuitry, such as integrated circuits within a die 104. In such embodiments, a wafer test system can evaluate the functionality and performance the functional circuitry while the die 104 is still part of the wafer 100. The wafer may also contain a test structure 204 or test key electrically connected to the test pads 202. In various embodiments, the test structure 204 is located within the die 104 and/or the reserved area 108. The test structure 204 contains a number of devices such as transistors, resistors, capacitors, memory cells, wiring patterns, ring oscillators and/or other devices relevant to product performance. Due to variations in manufacturing, the performance attributes of circuit elements may vary significantly from wafer to wafer and may even vary throughout a single wafer. Whereas it may be difficult to isolate and analyze individual devices within a functional circuit, test structures 204 provide a mechanism to test such attributes as resistance, capacitance, reference voltages, operating frequency, and delay in a simple and straightforward manner.

Figure 3:
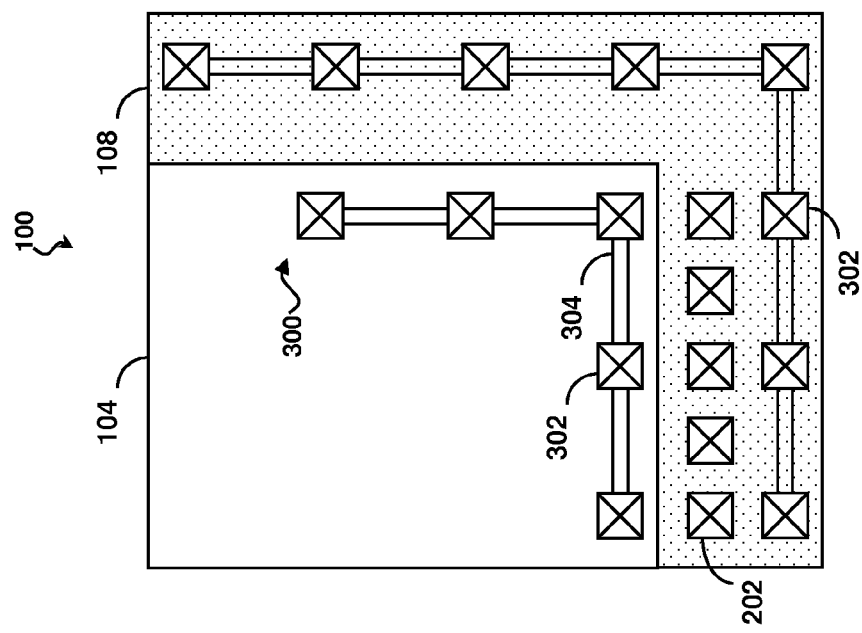
FIG. 3 is a simplified top view of an alignment structure within a region of a semiconductor wafer according to various aspects of the present disclosure.

FIG. 3 is a simplified top view of an alignment structure 300 within a region of a semiconductor wafer 100 according to various aspects of the present disclosure. FIG. 3 illustrates the border of a die 104 and a reserved area 108. In some embodiments, the wafer 100 includes an alignment structure 300 that facilitates test probe alignment. The alignment structure 300 includes one or more alignment pads 302 that have distinct electrical characteristics that allow a system such as a wafer test system to determine when contact is made with the pads 302. For example, alignment pads 302 may be connected via conductive traces 304 to create a short (a low resistance path) between pads 302. In other examples, alignment pads 302 can be identified by capacitance, resistance, connectivity (such as electrically connectivity to an identifiable device or structure), and/or other measurable electrical parameter. In the illustrated embodiment, the alignment pads 302 are arranged along two perpendicular axes to facilitate multi-dimensional alignment. Other embodiments may incorporate a single axis configuration.

The alignment pads 302 may serve as test pads 202. However, in some embodiments, particularly in but not limited to embodiments where the identifying characteristic may interfere with other testing, the wafer 100 also includes test pads 202 that are distinct from the alignment pads 302. In some such embodiments, the alignment pads 302 are arranged to facilitate in aligning test equipment with the test pads 202. For example, in an embodiment, properly aligning a test probe with an alignment pad 302 will align another test probe on the same probing device with a test pad 202. As further examples, in some embodiments, the alignment pads 302 are parallel or orthogonal to the test pads 202, and/or provide a reference location used to determine the location of the test pads 202.

Figure 4:
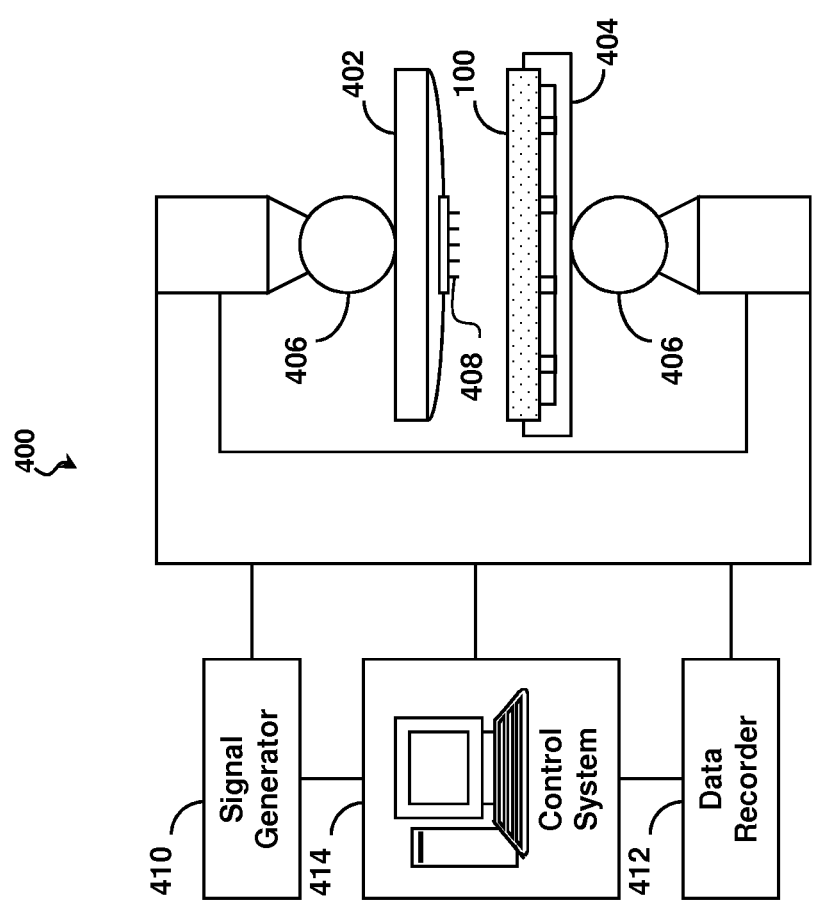
FIG. 4 is a schematic view of a wafer-level test system according to various aspects of the present disclosure.

FIG. 4 is a schematic view of a wafer-level test system 400 according to various aspects of the present disclosure. The wafer test system 400 includes a probe card 402 and a wafer chuck 404 designed to releasably secure a wafer 100. In various embodiments, either the chuck 404, the probe card 402, or both are attached to an articulated mount 406 (test head) such that the probe card 402 can be aligned to the wafer 100. In some embodiments, the wafer test system 400 includes a probe interface board (PIB, not shown) between the articulated mount 406 and the probe card 402. The PIB electrically couples the test system 400 to the probe card 402.

The probe card 402 contains one more probe points 408 designed to interface with the test pads 202 of the wafer 100. Exemplary materials for the probe points 408 include tungsten, a tungsten/rhenium alloy, beryllium, copper, palladium, and/or combinations thereof. In an embodiment, the probe points 408 have tapered ends that facilitate contact with the test pads 202. In some embodiments, the probe card 402 is a one-shot probe card. A one-shot probe card 402 contacts sufficient test pads 202 on the wafer 100 to allow the wafer test system to evaluate the wafer 100 and devices therein without relocating the probe card 402. In alternative embodiments, the probe card 402 is a stepped probe card 402. In this configuration, the probe card 402 contacts a subset of the test pads 202 on the wafer. In various embodiments, the subset is associated with a single die 104, a multiple die set (such as a group of 2, 4, 8, or 16 dies), and/or one or more test structures 204. Once the probe card 402 is used to test a first region of the wafer 100, the probe card 402 is removed and relocated to a second region to perform additional testing.

The test system 400 may also include a signal generator 410 to provide test signals and a data recorder 412 to collect testing results from the wafer 100. In some embodiments, the test system also includes a control system 414 to control the test procedure, to coordinate testing events among the test system 400 and the probe card 402, to analyze the test results, and to evaluate the wafer 100.

Figure 5A:
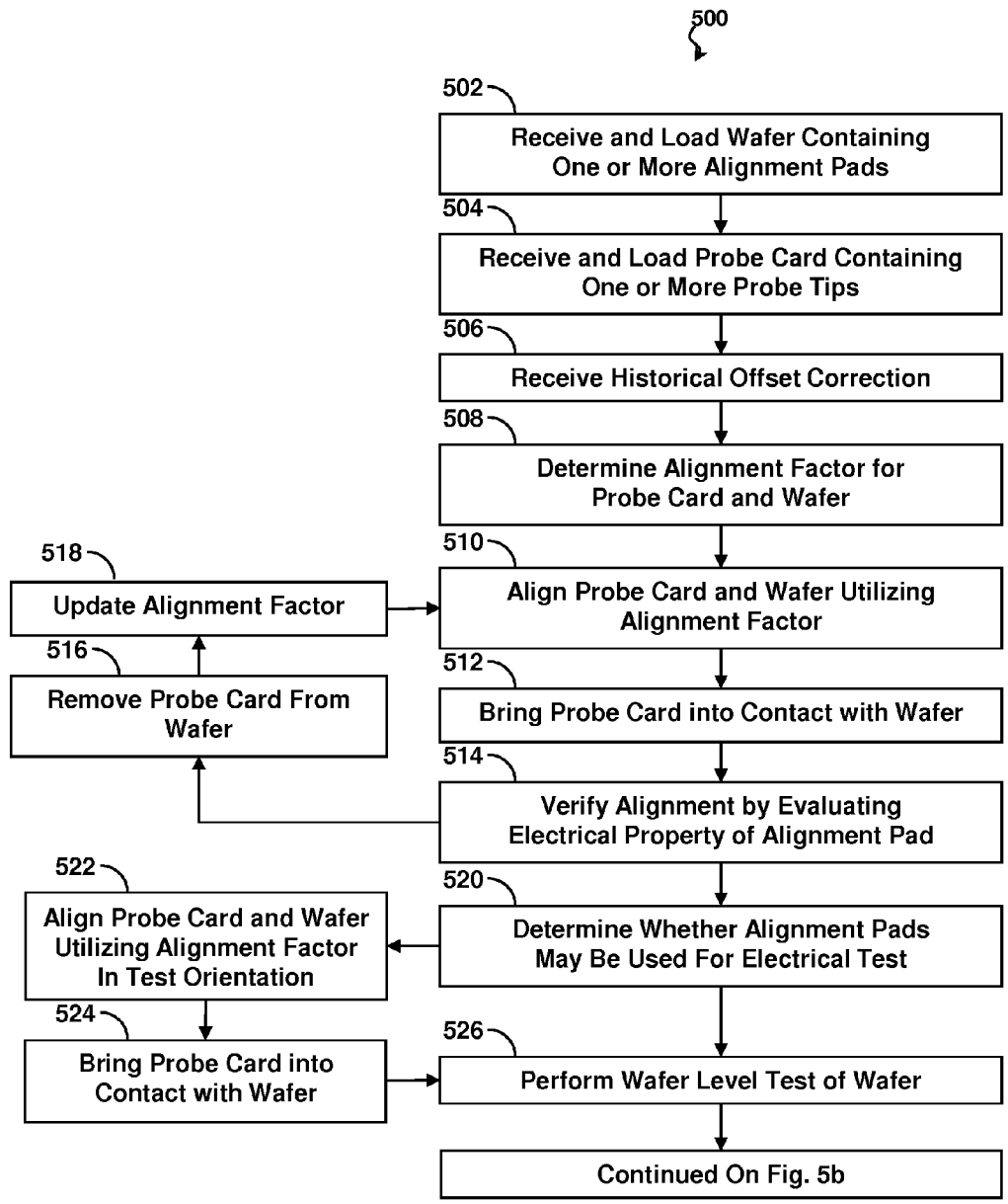
FIGS. 5a and 5b are flow diagrams of a method of performing a wafer-level device test according to various aspects of the present disclosure.
Figure 5B:
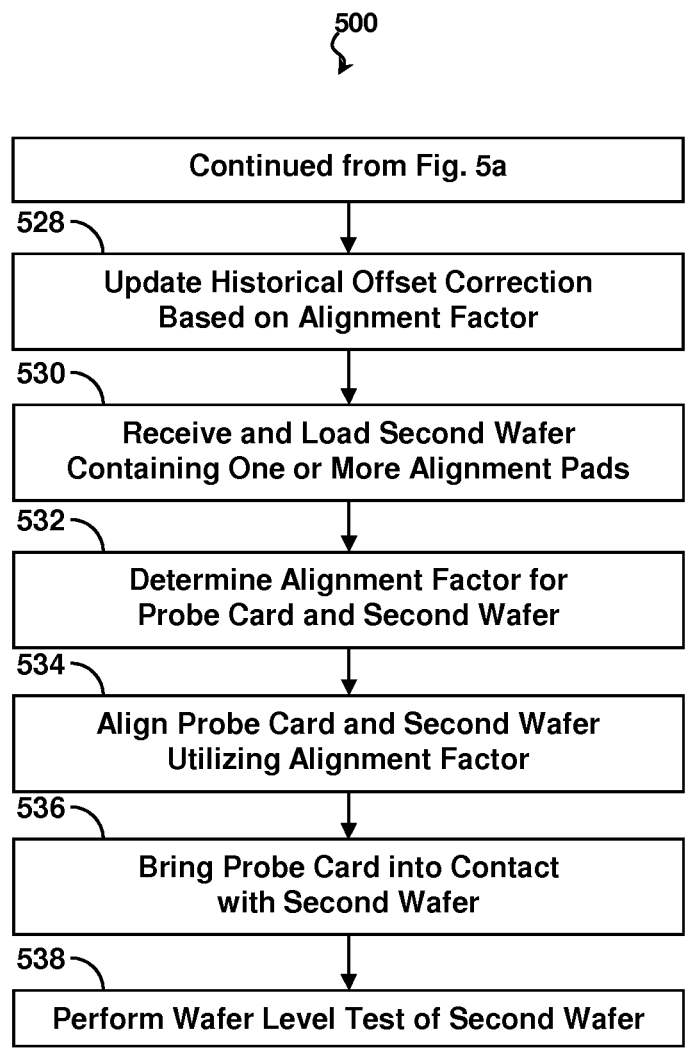

FIGS. 5a and 5b are flow diagrams of a method 500 of performing a wafer-level device test according to various aspects of the present disclosure. The method 500 is suitable for wafer-level testing such as may be performed by the system of FIG. 4. It is understood that additional steps can be provided before, during, and after the steps of method 500, and some of the steps described can be replaced or eliminated for other embodiments of the method. In block 502, a wafer 100 containing one or more alignment pads 302 is received and loaded into a wafer test system. In block 504, a probe card 402 is also received and loaded into the wafer test system. In block 506, a historical offset correction is received. The historical offset correction is a set of prior offset values that may be based on previous wafer-level tests using the current wafer, card, and system as well as other similar wafers, cards, and systems. In block 508, an alignment factor is determined for the combination of the probe card 402 and the wafer 100. The alignment factor can be represented as (X, Y, θ) coordinates corresponding to one or more relative orientations of the wafer 100 and the probe card 402. In an embodiment configured for a one-shot probe card 402, the alignment factor includes a single coordinate set determined to bring the probe card 402 into contact with the alignment pads 302. In an embodiment utilizing a stepped probe card 402, the alignment factor includes multiple coordinate sets, each corresponding to a group of alignment pads 302 and determined to bring the probe card 402 into contact with the particular group of alignment pads 302.

In various embodiments, the alignment factor reflects a number of characteristics of the test environment including the historical offset correction and characteristics of the design, of the wafer 100, of the probe card 402, and/or of the test system 400. With respect to the design, the design is the model used to produce the wafer and contains ideal locations of features including alignment pads 302 upon the wafer 100. In an embodiment, the alignment factor depends on the location of the alignment pads 302 within the design. With respect to wafer characteristics, the alignment factor may model a wide range of attributes. These include surface irregularities. For example, the profile of the backside and/or circumferential surface of the wafer 100 may affect the fit of the wafer 100 within the chuck 404. In an embodiment, the alignment factor accounts for the resulting effect on alignment pad location. As another example, the alignment factor may account for profile irregularities of the topside or active surface of the wafer 100 that affect alignment pad location. These irregularities may be due to process variations including variations in wafer shaping and planning, variations in layer alignment and layer formation, and other process variations. In an embodiment, the alignment factor also accounts for wafer warpage. Warpage is a particular type of deformation that may dramatically affect the location of the alignment pads 302. Wafer warpage may be caused by both internal and external forces acting upon the wafer. In some applications, wafer warpage becomes more pronounced as the size of the wafer 100 increases. This may be due in part to correlated increases in both internal and external forces and in part because strain (deformation due to force) is directly proportional to the size of the object experiencing the force. In further embodiments, the alignment factor will account for other wafer characteristics. As multiple examples of wafer characteristics are mentioned, one of skill in the art will recognize that, in various embodiments, the adjustment factor will model any one or more of the characteristics and no particular characteristic is required for any single embodiment.

The alignment factor may also model characteristics of the probe card 402. The alignment factor may include the location of the probe points 408 on the probe card 402 as designed. Similar to a wafer 100, the probe points 408 may be offset due to the fit of the probe card 402 within the test system 400, due to process variations, and/or due to deforming forces both internal and external. Additionally, a nonplanar wafer surface may distort the probe card 402 affecting the location of the probe points 408 and thereby the alignment. In some embodiments, the alignment factor accounts for these and other aspects of the probe card 402. No particular aspect is required for any single embodiment.

With regard to the test environment, the alignment factor may also model alignment factors that are not accounted for by the design or characteristics of the wafer 100 or the probe card 402. In an embodiment, these attributes of the test system or test environment include a variability factor, c, which is modeled in the alignment factor.

In some embodiments, determining an alignment factor includes performing a regression analysis based on historical and current alignment data. In one such embodiment, the regression analysis is a form of multiple regression modeling. In one exemplary embodiment, where a wafer 100 has n testing orientations corresponding to n different stepped testing arrangements of the probe card 402 and wafer 100, the alignment factor can be determined as follows:

$$AF = \frac{E}{Q}$$

where AF is the alignment factor, E is the offset between the pads 302 and the probes 408, and Q is the probe sensitivity to offset. Q, the probe sensitivity, is an attribute of the wafer test system 400 and in various embodiments ranges from 0.9 to 1.2. The offset, E, may be modeled as:

$$E = \eta(Y - Y_{LT})$$

where $\eta$ is a learning ratio (which, in some embodiments, ranges from 0.5 to 1.5 and in a mature technology may approach 1.0), Y is the calculated offset, and $Y_{LT}$ is an offset correction factor based on long-term analysis of the offset. In the present embodiment, Y and $Y_{LT}$ are determined by utilizing a multiple regression model as follows:

$$\begin{bmatrix} Y_1 \\ Y_2 \\ \vdots \\ Y_n \end{bmatrix} \equiv \begin{bmatrix} x_{1(1)} & x_{2(1)} & x_{3(1)} \\ x_{1(2)} & x_{2(2)} & x_{3(2)} \\ \vdots & \vdots & \vdots \\ x_{1(n)} & x_{2(n)} & x_{3(n)} \end{bmatrix} \begin{bmatrix} a_1 \\ a_2 \\ a_3 \end{bmatrix} + \begin{bmatrix} \varepsilon_1 \\ \varepsilon_2 \\ \vdots \\ \varepsilon_n \end{bmatrix}$$

$$\begin{bmatrix} Y_{1LT} \\ Y_{2LT} \\ \vdots \\ Y_{nLT} \end{bmatrix} \equiv \begin{bmatrix} x_{1(1)LT} & x_{2(1)LT} & x_{3(1)LT} \\ x_{1(2)LT} & x_{2(2)LT} & x_{3(2)LT} \\ \vdots & \vdots & \vdots \\ x_{1(n)LT} & x_{2(n)LT} & x_{3(n)LT} \end{bmatrix} \begin{bmatrix} a_1 \\ a_2 \\ a_3 \end{bmatrix} + \begin{bmatrix} \varepsilon_1 \\ \varepsilon_2 \\ \vdots \\ \varepsilon_n \end{bmatrix}$$

Referring to the regression model for Y: $Y_1$ through $Y_n$ are offsets at each of n testing arrangements of the probe card 402 and the wafer 100. Factors $x_{1(1)}$ through $x_{1(n)}$ are ideal offsets of the probe card 402 and wafer 100 at each testing arrangement. Factors $x_{2(1)}$ through $x_{2(n)}$ are deviations of the wafer 100 from the ideal. Factors $x_{3(1)}$ through $x_{3(n)}$ represent deviations of the probe card 402 from the ideal. Factors $a_1$ through $a_3$ are regression coefficients. Factors $\in_1$ through $\in_n$ are uncertainty and variability factors. The regression model for $Y_{LT}$ is similar. $Y_{1LT}$ through $Y_{nLT}$ are historical values of the offset correction factor at each of n testing arrangements of the probe card 402 and the wafer 100. Factors $x_{1(1)LT}$ through $x_{1(n)LT}$ re long-term systemic offset correction factors at each testing arrangement. Factors $x_{2(1)LT}$ through $x_{2(n)T}$ are long-term offset correction factors based on the wafer 100. Factors $X_{3(1)LT}$ through $x_{3(n)LT}$ are long-term offset correction factors for the probe card. Factors $a_1$ through $a_3$ are the regression coefficients. Factors $\in_1$ through $\in_n$ are uncertainty and variability factors.

Other embodiments utilize other forms of regression analysis to determine the alignment factor. In an embodiment, the alignment factor is determined by applying a multivariate analysis of variance (MANOVA) procedure. In an embodiment, an alignment factor is determined via partial least squares regression (PLS).

Referring to block 510 of FIGS. 5*a* and 5*b*, the alignment factor is used to align the probe card 402 with the wafer 100. In block 512, the probe card 402 is brought into contact with the wafer 100. In block 514, the alignment is verified by evaluating an electrical property of the connection between the probe card 402 and the wafer 100. If the connectivity is not satisfactory, in block 516, the probe card 402 is lifted from the wafer 100. In block 518, the alignment factor is updated and the method returns to block 510. If the probe card 402 and wafer 100 are properly aligned in block 514, the method proceeds to block 520 where it is determined whether the currently connected alignment pads 302 are also test pads 202. In an embodiment, the alignment pads 302 are not test pads 202 and are thus not suitable for verification and performance testing. In another embodiment, the alignment pads 302 are also test pads 202. If the alignment pads 302 cannot be utilized for testing, the method proceeds to block 522 where the alignment factor is utilized to align the probe card 402 with the wafer 100 in a testing orientation. In block 524, the probe card 402 is brought into contact with the wafer 100. In block 526, a wafer-level test such as an electrical parameter test is performed. If the alignment pads 302 can be utilized for testing, the method proceeds from block 520 to block 526 where the wafer-level test is performed. In block 528, the historical offset correction is updated based on the alignment factor.

In block 530, a second wafer containing a plurality of alignment pads 302 is received and loaded into the wafer test system 400. In block 532, an alignment factor for the second wafer is determined for the combination of the probe card 402 and the second wafer based on the long-term alignment factor. In an embodiment, the long-term alignment factor used in block 532 has been updated based on the prior alignment of the probe card 402 and the previous wafer. This may lead to a more accurate initial alignment and may reduce the number of realignment procedures required. Moreover, this process may improve accuracy, reduce risk of damage to the wafer or the probe card 402, and reduce testing time. The processes of alignment, evaluation, and electrical testing of the second wafer proceeds in substantially similar manner to that of the previous wafer. For example, in block 534, the alignment factor is used to align the probe card 402 with the second wafer 100. In block 536, the probe card 402 is brought into contact with the second wafer 100. In block 538, a wafer-level test is performed on the second wafer 100.

FIG. 6 is a flow diagram of a method 600 of evaluating the alignment of a probe card 402 and a wafer 100 according to aspects of the present disclosure. The method 600 is suitable, for example, for performing the procedures described in blocks 508-518 of the method 500. It is understood that additional steps can be provided before, during, and after the steps of method 600, and some of the steps described can be replaced or eliminated for other embodiments of the method.

In block 602, a probe card 402 having probe points 408 is oriented relative to a wafer 100. The orientation of the probe card 402 and the wafer 100 is determined by an alignment factor. In an embodiment, the alignment factor is determined by a regression analysis such as the regression analysis disclosed above. In some embodiments, the wafer 100 includes alignment pads 302 that have identifiable electrical characteristic. In one such embodiment, the alignment pads 302 are connected via a conductive trace 304. Thus, the identifiable characteristic is a low electrical resistance between alignment pads 302. In other examples, alignment pads 302 can be identified by capacitance, resistance, connectivity (such as electrical connectivity to an identifiable device or structure), and/or other measurable electrical parameter.

In block 604, the probe card 402 is brought into contact with the wafer 100. In block 606, a wafer test system 400 electrically connected to the probe card 402 tests for the identifiable electrical characteristics to determine whether the probe points 408 contact the alignment pads 302. In an embodiment, the wafer test system 400 measures the resistance between a pair of probe points 408. If the measured resistance exceeds a threshold value, for example 20Ω, the wafer test system 400 reports that at least one of the probe points 408 of the pair is not in contact with an alignment pad 302.

If the alignment test of block 606 does not indicate proper alignment, the method 600 proceeds to block 608 where alignment factor is adjusted. The method 600 then proceeds to block 602 where the probe card and wafer are oriented again, this time using the adjusted alignment factor. On the other hand, if the alignment test of block 606 indicates the probe card 402 and wafer 100 are correctly aligned, the method 600 proceeds to block 610 where further electrical testing is performed using the alignment factor.

Thus, the present invention provides a system and method for aligning a probe device with wafer test pads. In one embodiment, the method comprises: receiving a wafer containing a plurality of alignment pads at a wafer test system; receiving a probe card containing a plurality of probe points at the wafer test system; receiving a historical offset correction; determining an orientation value for the probe card relative to the wafer based on the historical offset correction; aligning the probe card to the wafer using the orientation value, wherein the aligning is an attempt to bring a first probe point of the plurality of probe points into contact with a first alignment pad of the plurality of alignment pads. The method may further comprise evaluating connectivity of the first probe point and the first alignment pad; and when it is determined that the first probe point and the first alignment pad are connected: performing an electrical test of the wafer utilizing the aligned probe card; and updating the historical offset correction based on the orientation value.

In a further embodiment, the method comprises: determining a characteristic of a semiconductor wafer affecting a location of a alignment pad disposed on the semiconductor wafer; determining a characteristic of a probe card affecting a location of a probe point disposed on the probe card; receiving a long-term baseline factor for aligning the alignment pad and the probe point; determining an alignment factor for orienting the probe point and the alignment pad based on the characteristic of the semiconductor wafer, the characteristic of the probe card, and the long-term baseline factor; bringing the probe card and the semiconductor wafer into contact at an orientation determined by the alignment factor; thereafter performing an electrical test of the semiconductor wafer using the contacting probe card; and updating the long-term baseline factor based on the alignment factor.

In yet another embodiment, the wafer comprises: a substrate; one or more dies disposed on the substrate; a reserved area disposed on the substrate outside of the one or more dies; and an alignment structure disposed on the substrate and including one or more alignment pads, the alignment structure configured to align the wafer to a probe within a wafer test system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   determining a characteristic of a semiconductor wafer affecting a location of an alignment pad disposed on the semiconductor wafer;
   determining a characteristic of a probe card affecting a location of a probe point disposed on the probe card;
   receiving a long-term baseline factor for aligning the alignment pad and the probe point;
   determining an alignment factor for orienting the probe point and the alignment pad based on the characteristic of the semiconductor wafer, the characteristic of the probe card, and the long-term baseline factor;
   bringing the probe card and the semiconductor wafer into contact at an orientation determined by the alignment factor;
   thereafter performing an electrical test of the semiconductor wafer using the contacting probe card; and
   updating the long-term baseline factor based on the alignment factor.

2. The method of claim 1, wherein the semiconductor wafer is a first semiconductor wafer and the alignment pad is a first alignment pad, the method further including:
   determining a characteristic of a second semiconductor wafer affecting a location of a second alignment pad disposed on the second semiconductor wafer;
   determining a second alignment factor for orienting the probe point and the second alignment pad based on the characteristic of the second semiconductor wafer, the characteristic of the probe card, and the updated long-term baseline value;
   bringing the probe card and the second semiconductor wafer into contact at an orientation determined by the second alignment factor;
   thereafter performing an electrical test of the second semiconductor wafer using the contacting probe card; and
   updating the long-term baseline value based on the second alignment factor.

3. The method of claim 1, wherein the determining of the alignment factor includes at least one of a multiple regression model analysis, a multivariate analysis of variance, and a partial least squares regression analysis.

4. The method of claim 1, wherein the orientation used in the bringing of the probe card and the semiconductor wafer into contact is a first orientation determined to align the alignment pad and the probe point,
   the method further including:
      removing the probe card from the semiconductor wafer after the bringing in to contact at the first orientation; and
      thereafter bringing of the probe card and the semiconductor wafer into contact at a second orientation determined by the alignment factor, the second orientation determined to align the probe point and a test pad disposed on the semiconductor wafer;
   wherein the performing of the electrical test is performed using the probe card contacting at the second orientation.

5. The method of claim 1, further comprising:
   evaluating connectivity of the probe point and the alignment pad after the bringing of the probe card and the semiconductor wafer into contact; and
   when it is determined from the evaluating of the connectivity that the probe point is not connected to the alignment pad:
      modifying the alignment factor;
      separating the probe card from the semiconductor wafer; and
      thereafter bringing the probe card and the semiconductor wafer into contact using the modified alignment factor.

6. The method of claim 5, wherein the evaluating of the connectivity includes detecting an identifying electrical property of the alignment pad.

7. The method of claim 6, wherein the electrical property is a low-resistance connection between the alignment pad and another alignment pad disposed on the semiconductor wafer.

8. The method of claim 7, wherein the low-resistance connection has a resistance of less than 20Ω.

9. A method comprising:
   receiving a wafer having a pad disposed thereupon;
   receiving a probe card having a probe point;
   receiving a historical alignment factor for aligning the pad and the probe point;
   bringing the probe card and the wafer into contact at an orientation determined based on the historical alignment factor; and
   thereafter performing an electrical test of the wafer using the probe card.

10. The method of claim 9, further comprising updating the historical alignment based on the orientation.

11. The method of claim 9, wherein the orientation is further determined based on at least one of: a characteristic of the wafer, a pattern formed upon the wafer, a characteristic of the probe card, or a characteristic of a wafer test system.

12. The method of claim 9, further comprising:
   evaluating the orientation after the bringing of the probe card and the wafer into contact using a measurement of at least one of: a capacitance, a resistance, or an electrical connectivity.

13. The method of claim 9, wherein the orientation is further determined based on a wafer surface irregularity.

14. The method of claim 9, wherein the orientation is further determined based on an alignment of the wafer in a wafer chuck.

15. The method of claim 9, wherein the orientation is further determined based on a deforming force having acted upon the probe card.

16. A method comprising:
   identifying a pad of a wafer for testing;
   receiving an alignment baseline for aligning the pad with a test probe;
   determining a characteristic of a probe card that includes the test probe;
   determining an alignment factor based on the alignment baseline and the determined characteristic of the probe card;
   aligning the pad with the test probe using the alignment factor; and
   performing an electrical test of the wafer using the aligned pad and the test probe.

17. The method of claim 16 further comprising:
   updating the alignment baseline based on the aligning of the pad with the test probe.

18. The method of claim 16, wherein the determined characteristic of the probe card accounts for a deforming force having acted upon the probe card.

19. The method of claim 16 further comprising:
  evaluating connectivity of the pad and the test probe after the aligning of the pad with the test probe.

20. The method of claim 19, wherein the evaluating of the connectivity of the pad and the test probe is based on a measurement of at least one of a capacitance, a resistance, or an electrical connectivity.

* * * * *